United States Patent
Cha et al.

[11] Patent Number: 6,064,201
[45] Date of Patent: May 16, 2000

[54] METHOD AND APPARATUS TO IMAGE METALLIC PATCHES EMBEDDED IN A NON-METAL SURFACE

[75] Inventors: Cher Liang Randall Cha; Hao Gong; Eng Fong Chor, all of Singapore, Singapore; Lap Chan, San Francisco, Calif.

[73] Assignees: Chartered Semiconductor Manufacturing Ltd.; National University of Singapore, both of Singapore, Singapore

[21] Appl. No.: 09/114,125

[22] Filed: Jul. 13, 1998

[51] Int. Cl.[7] .......................... G01N 27/90; N01R 33/00; N01R 33/12; N01R 31/00; G01V 3/00
[52] U.S. Cl. .......................... 324/228; 324/226; 324/235; 324/244.1; 324/256; 324/259; 324/262; 324/762
[58] Field of Search ...................... 324/226, 228, 324/234, 235, 238, 244, 244.1, 256, 257, 259–262, 557–559, 762, 765

[56] References Cited

U.S. PATENT DOCUMENTS

| | | | |
|---|---|---|---|
| 4,190,799 | 2/1980 | Miller et al. | 324/239 |
| 4,857,839 | 8/1989 | Look et al. | 324/158 |
| 4,866,383 | 9/1989 | Taliaferro | 324/228 |
| 4,887,032 | 12/1989 | Hetrick | 324/256 X |
| 5,266,897 | 11/1993 | Watanuki et al. | 324/244 |
| 5,309,096 | 5/1994 | Hoegnelid | 324/256 |
| 5,315,247 | 5/1994 | Kaiser et al. | 324/244 |
| 5,900,728 | 5/1999 | Moser et al. | 324/260 X |
| 5,900,729 | 5/1999 | Moser et al. | 324/260 X |

FOREIGN PATENT DOCUMENTS 4-294288  10/1992  Japan ..................... 324/256

*Primary Examiner*—Gerard Strecker
*Attorney, Agent, or Firm*—George O. Saile; Stephen B. Ackerman

[57] ABSTRACT

Small metallic patches embedded in a mainly non-metallic surface may be detected and mapped by placing a wire coil at the free end of a cantilever, with a fine tip made of a ferro-magnetic material located at its center. An alternating current is passed through the coil so that when it is near a metallic patch eddy currents are induced in the patch. These produce a small magnetic moment in the patch which pulls the tip towards the surface. This movement of the tip is detected by observing a light beam that is reflected off the surface of the cantilever. By plotting the output of a photodetector, sensistive to small changes in the reflected beam's position, as a function of the tip's location over the surface, a map of the metallic patches is produced.

17 Claims, 2 Drawing Sheets

METHOD AND APPARATUS TO IMAGE METALLIC PATCHES EMBEDDED IN A NON-METAL SURFACE

FIELD OF THE INVENTION

The invention relates to the general field of surface studies with particular reference to the detection of small metallic patches present at the surface of a non-metal.

BACKGROUND OF THE INVENTION

A number of different types of Scanning Probe Microscopes are in existence. They operate on different principles, depending on the intended application. Examples include the scanning laser microscope, the scanning thermal microscope, the scanning capacitive microscope, the magnetic force microscope (MFM), the atomic force microscope (AFM), and the scanning tunnel microscope (STM). They are used mainly for surface studies.

For example, the STM is used to study the topography of conductive surfaces, by monitoring changes in the tunnelling current between the surface and a sharp tip. AFMs are usually used to provide 3-D images of non-conductive surfaces, including surface absorbates, via atomic force (van der Waals) attraction and repulsion between the AFM tip and the surface atoms. MFMs are generally used to detect the presence of magnetic materials, via usage of a permanent magnet.

None of the above described microscopes are capable of detecting the presence of small metallic patches present in the surface of a semiconductor or an insulator. As will be described in detail below, the present invention achieves this through a combination of eddy current generation and magnetic detection. In searching the prior art we have not come across any devices that detect metal patches in this manner. The following references were, however, found to be of interest:

Miller et al. (U.S. Pat. No. 4,190,799 Feburay 1980) describe a non-contacting method for measuring the Hall effect in a wafer. An eddy current is induced in the wafer from a pair of concentric co-planar electrodes. A strong external magnetic field is applied perpendicular to the electrodes. The Hall effect then leads to the presence of a circular component of RF current in the wafer (whose center is the inner co-planar electrode). This, in turn, generates an RF magnetic field (superimposed on the DC field) that is detected by a pickup coil.

Look et al. (U.S. Pat. No. 4,857,839 August 1989) measure the Hall effect in a wafer by successive rotation of the positions of all contacts (those used to supply current and those used to detect the Hall voltage).

Watanuki et al. (U.S. Pat. No. 5,266,897 November 1993) describe a tunnelling microscope having a tip made of magnetic material. When scanned over a region containing magnetic material, the tip is attracted to, or repelled from, the surface. The change in its distance from the surface is reflected as a change in the tunnelling current between the tip and the surface.

SUMMARY OF THE INVENTION

It has been an object of the present invention to provide a method for detecting and mapping small metallic patches embedded in a non-metallic surface.

Another object of the invention has been to provide a device suitable for the execution of said method.

A still further object has been that metallic patches as small as 10 Angstroms across be detectable using said method and device.

These objects have been achieved by placing a wire coil near the free end of a cantilever over a fine tip made of, or coated with, a ferromagnetic material. An alternating current is passed through the coil so that when it is near a metallic patch, within the mainly non-metallic surface, eddy currents are induced in the patch. These produce a small magnetic moment in the patch which attracts the tip towards the surface. This movement of the tip is detected by observing a light beam that has been reflected off the surface of the cantilever. By plotting the output of a photodetector, sensistive to small changes in the reflected beam's intensity, as a function of the tip's location over the surface, a map of the metallic areas is produced.

DESCRIPTION OF THE PREFERRED EMBODIMENTS

The basic principle on which the present invention is based is that eddy currents will be induced in an electrical conductor when it is close to a wire carrying an alternating current. These eddy currents, in turn, cause the conductor to behave like a small magnet, generating a small magnetic field which will interact in the usual way with any magnetic material that is near it, most commonly by being attracted to it. If the conductor in question is a small patch of conductive material embedded in a non-metallic surface, then the magnetic effect induced by the alternating current will be limited to the patch, the surrounding, non-metallic material being unaffected.

In general, very sensitive means will be needed to reliably detect small patches of the size which the present invention seeks to detect—typically having a diameter between about 10 and 1,000 Angstroms. The means used by the present invention is a ferromagnetic tip (or a tip of non-magnetic material having a coating of ferromagnetic material) that is placed within a distance of between about 10 and 1,000 Angstroms from the surface being investigated.

The small magnetic moment induced in the patch is sufficient to make the tip move towards it as the tip is located at the free end of a small cantilever beam where its movement is almost unrestricted. The movement of the tip is detected by observing the movement of a light beam reflected off the top surface of the cantilever. The tip has a small radius of curvature (generally between about 10 and 50 nanometers) both to increase its resolution relative to the various patches as well as to concentrate the lines of magnetic induction, thereby increasing the strength of the attractive force between it and the patch.

Figure 1:
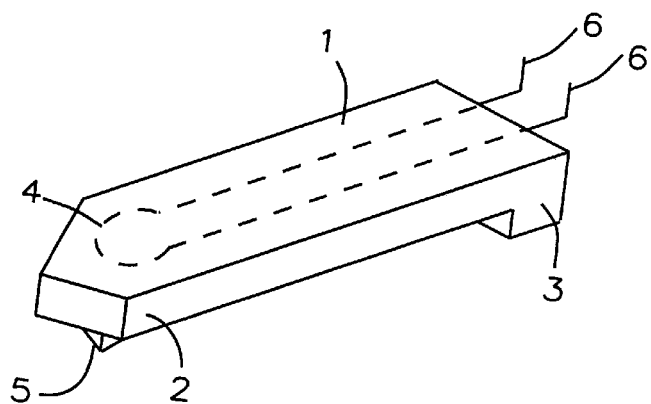
FIG. 1 is an isometric view of the device disclosed in the present invention.

Referring now to FIG. 1, we show an isometric view of the basic apparatus. Cantilever 1, typically of silicon, having a length between about 100 and 500 microns, a width between about 10 and 50 microns, and a thickness between about 0.5 and 5 microns, has a free end 2 and a fixed end 3. Coil 4 of conductive material is located on the cantilever at its free end with the probe tip at its center. Although shown in the figure as having only a single coil, 4 could have between about 5 and 50 turns, depending on wire material, wire thickness, the presence of other electrical components, etc. It emerges at the fixed side 3 as wires 6 which are connected to a source of electrical voltage which is typically between about 0.01 and 100 millivolts with a frequency range from 1 to $10_9$ Hz, leading to a current in the coil between about 0.001 and 0.1 mA.

Also shown in FIG. 1 is tip 5 which is located at the free end of the cantilever, extending downwards from the cantilever's lower surface. Tip 5 may be made entirely of a ferromagnetic material such as iron, cobalt, nickel, or cobalt-platinum, or it could be made of a non-magnetic material such as silicon or silicon nitride, coated with a layer of one of the afore-mentioned ferromagnetic materials. For adequate sensitivity, said layer needs to be at least 500 microns thick. The latter design is preferred when a finer tip is needed. The preferred embodiment for the coated version is to form both the cantilever and the tip from a single crystal of silicon.

Figure 2:
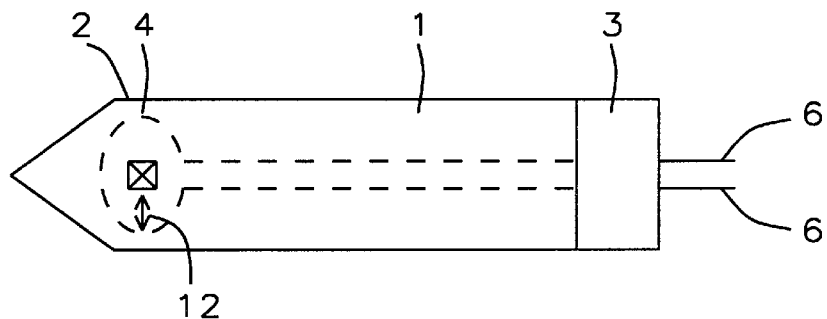
FIG. 2 is a plan view, looking from the bottom upwards, of the device.

In FIG. 2 we show a plan view of the device, looking at its underside from a point below it. Of interest is the distance 12 between the tip's edge and the circumference of the coil (the tip and the coil being concentric). This distance is typically between about 0.1 and 1 micron and represents a compromise between maximizing the strength of the eddy current in a metallic patch immediately below the tip and the greater sensitivity and resolution of the tip (due to field enhancement) associated with having a smaller coil.

Figure 3:
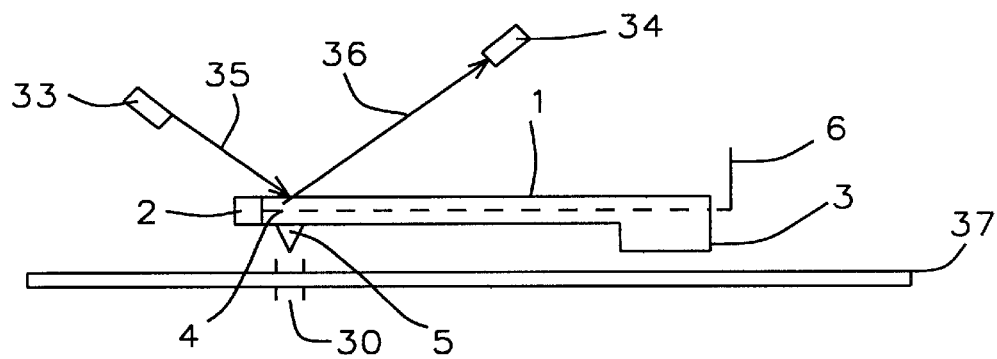
FIG. 3 is a side view of the device additionally illustrating the optical method used to detect motion of the tip.

FIG. 3 is a side view of the device to which has been added schematic representations of the surface 37 being scanned and the tip motion detection mechanism. The latter consists of the light source 33 which is usually a diode laser such as aluminum gallium arsenide, gallium nitride, etc., and the photodetector 34 which is preferably, but not necessarily, a photomultiplier such as manufactured by Burle industries, RCA (USA), Lecroy Corp., EMI, or St. John associates, etc. Incoming light beam 35 is reflected from the top surface of cantilever 1 at a point above tip 5.

When there is no movement of the free end 2 of the cantilever, reflected beam 36 is centered on photodetector 34. When tip 5 moves towards the magnet that has been induced in metallic patch 30, embedded in non-metallic surface 37, reflected beam 36 is deflected away from detector 34. The latter has a very narrow angle of acceptance (estimated to be about 2–5 degrees of arc) resulting in a change in output current from 34 in the range of about 0.001 to 0.1 milliamps. This is associated with locating 33 and 34 above the cantilever with a horizontal separation between them.

Figure 4:
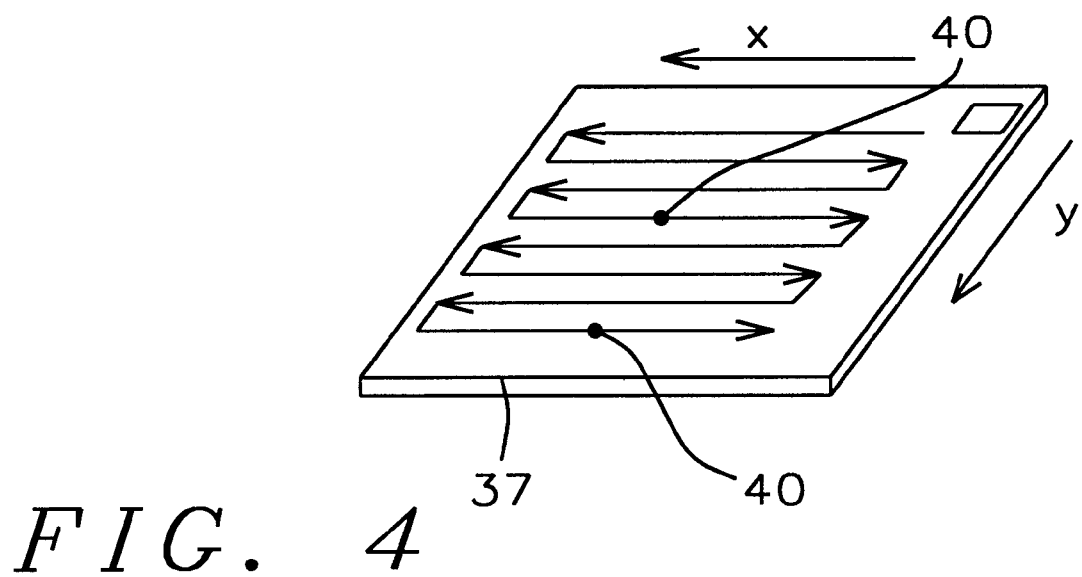
FIG. 4 schematically illustrates a scan of the surface by the device, including visualization of two metallic patches within the non-metallic surface.

To use the device, it is necessary to mount the light source and the photodetector relative to the cantilever and the surface being checked so that when the tip is caused to scan the surface (as illustrated in FIG. 4) all these various parts move together and no motion of the tip is detected unless it is attracted by, and therefore moves towards, surface 37.

When that happens, the output of the photodetector will drop significantly so that by displaying said output as a function of the tip's position over the surface, a plot showing any and all metallic patches embedded in the non-metallic surface will be obtained. In FIG. 4 are shown two examples 40 of possible metallic patches plotted in this way. We estimate the minimum patch size detectable, using the equipment as described above, to have a diameter of about 50 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method for mapping metallic patches embedded in a non-metal surface, comprising:

providing a horizontal cantilever having upper and lower surfaces and a free end;

attaching an electrical coil, having a center, to the lower surface at said free end;

attaching a tip, that includes ferromagnetic material, at the center of the coil, said tip projecting downwards from said lower surface;

directing a beam of light at said upper surface whereby said beam is reflected and enters a photodetector having an output;

while passing alternating current through said coil, simultaneously moving the cantilever, the light beam, and the photodetector whereby the entire surface, including said embedded metallic patches, is scanned; and plotting the output of the photodetector as a function of the position of the tip over the non-metal surface, said output peaking in value whenever the tip passes over one of said metallic patches.

2. The method of claim 1 wherein the coil further comprises between 5 and about 50 turns.

3. The method of claim 1 wherein the tip has a radius of curvature between about 10 and 50 nanometers.

4. The method of claim 1 wherein the tip is a non magnet coated with a layer of magnetic material.

5. The method of claim 4 wherein the non magnet is selected from the group consisting of silicon and silicon nitride and the magnetic coating is selected from the group consisting of iron, cobalt, nickel, and cobalt-platinum.

6. The method of claim 1 wherein the light beam is a laser beam.

7. The method of claim 1 wherein the photodetector is a photo-multiplier.

8. The method of claim 1 wherein the alternating current has a frequency range from 1 to about $10_9$ Hz.

9. The method of claim 1 wherein the patches have diameters between about 10 and 1,000 Angstroms.

10. A device for mapping metallic patches, comprising:

a non-metal surface in which are embedded said metallic patches;

a cantilever having a horizontal lower surface and a free end;

a tip having an edge and comprising, at least in part, ferromagnetic material, attached to, and extending downwards from, said cantilever lower surface;

a coil of electrically conductive wire, having a center and a circumference, lying on and in the plane of, the lower surface at said free end;

the tip being located at the center of the coil;

means for maintaining a distance between the tip and the non-metal surface;

a laser beam oriented to shine onto, and be reflected from, a surface of the cantilever;

a photodetector oriented to receive the reflected laser beam; and means to move the cantilever, the laser beam, and the photodetector simultaneously over said non-metal surface.

11. The device of claim 10 wherein the cantilever has a length that is between about 100 and 500 microns.

12. The device of claim 10 wherein the coil comprises a number of turns wound around a center in a circle that has a diameter that is between about 10 and 50 microns.

13. The device of claim 15 wherein the edge of the tip and the circumference of the coil are separated by between about 0.1 and 1 microns.

14. The device of claim 12 wherein said number of turns is between about 5 and 50.

15. The device of claim 10 wherein the distance between the tip and the surface is between about 10 and 1,000 Angstroms.

16. The method device of claim 10 wherein said tip is comprised entirely of ferromagnetic material selected from the group consisting of iron, cobalt, nickel, and cobalt-platinum.

17. The device of claim 10 wherein said tip comprises a core selected from the group consisting of silicon and silicon nitride overcoated with a layer of ferromagnetic material selected from the group consisting of iron, cobalt, nickel, and cobalt-platinum.

* * * * *